(12) United States Patent
Yuan et al.

(10) Patent No.: US 10,340,326 B2
(45) Date of Patent: Jul. 2, 2019

(54) FLEXIBLE DISPLAY APPARATUS HAVING A BENDING AREA CUTOUT

(71) Applicant: Shanghai Tianma Micro-Electronics Co., Ltd., Shanghai (CN)

(72) Inventors: Shipeng Yuan, Shanghai (CN); Wenxin Jiang, Shanghai (CN); Gang Liu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 15/913,071

(22) Filed: Mar. 6, 2018

(65) Prior Publication Data

US 2018/0197935 A1  Jul. 12, 2018

(30) Foreign Application Priority Data

Dec. 20, 2017  (CN) .......................... 2017 1 1383479

(51) Int. Cl.
| | | |
|---|---|---|
| *H01L 23/49* | (2006.01) | |
| *H01L 27/32* | (2006.01) | |
| *H01L 41/04* | (2006.01) | |
| *H01L 51/00* | (2006.01) | |
| *H05K 3/36* | (2006.01) | |
| *H01L 51/52* | (2006.01) | |
| *H01L 23/498* | (2006.01) | |
| *H01L 23/495* | (2006.01) | |
| *H01L 41/047* | (2006.01) | |

(52) U.S. Cl.
CPC ...... *H01L 27/3276* (2013.01); *H01L 51/0097* (2013.01); *H01L 23/4985* (2013.01); *H01L 23/49572* (2013.01); *H01L 23/49855* (2013.01); *H01L 41/0475* (2013.01); *H01L 51/5253* (2013.01); *H01L 2227/323* (2013.01); *H05K 3/361* (2013.01); *Y02E 10/549* (2013.01)

(58) Field of Classification Search
CPC .......... H01L 23/4985; H01L 23/49572; H01L 23/49855; H01L 27/3276; H01L 41/0475; H01L 51/0097; H01R 9/07; H01R 9/0764; H05K 3/361
See application file for complete search history.

(56) References Cited

U.S. PATENT DOCUMENTS

| | | | | |
|---|---|---|---|---|
| 5,428,190 A * | 6/1995 | Stopperan | .............. | H05K 3/323 174/250 |
| 5,600,179 A * | 2/1997 | Suzuki | ................ | H01L 23/3121 257/690 |
| 6,358,772 B2 * | 3/2002 | Miyoshi | .............. | H01L 23/3107 438/106 |
| 6,956,288 B2 * | 10/2005 | Ueno | .................. | G02F 1/13452 257/734 |

(Continued)

FOREIGN PATENT DOCUMENTS

CN             106449695 A       2/2017

*Primary Examiner* — Ida M Soward
(74) *Attorney, Agent, or Firm* — Anova Law Group, PLLC

(57) ABSTRACT

A flexible display apparatus is provided, including a flexible substrate including a bending area, an insulating layer formed on the flexible substrate and including at least one cutout at the bending area, and a plurality of wires configured following a surface shape of the insulating layer at the bending area. The at least one cutout includes sloped sidewalls protruding away from the flexible substrate.

20 Claims, 10 Drawing Sheets

(56) References Cited

U.S. PATENT DOCUMENTS

| | | | |
|---|---|---|---|
| 7,348,492 B1* | 3/2008 | Kawai | G02F 1/13452 |
| | | | 174/254 |
| 9,276,055 B1* | 3/2016 | Son | H01L 27/3276 |
| 9,349,969 B2* | 5/2016 | Kwon | H01L 51/0097 |
| 9,553,275 B2* | 1/2017 | Kim | H01L 51/0097 |
| 9,865,670 B2* | 1/2018 | Park | H01L 27/3276 |
| 9,929,374 B2* | 3/2018 | Jin | H01L 51/5246 |
| 9,991,456 B2* | 6/2018 | Senda | H01L 51/5253 |
| 10,074,673 B2* | 9/2018 | Choi | H01L 27/1244 |
| 10,121,988 B2* | 11/2018 | Oh | H01L 27/323 |
| 2002/0180022 A1* | 12/2002 | Emoto | H01L 23/3107 |
| | | | 257/686 |
| 2014/0217397 A1* | 8/2014 | Kwak | H01L 27/1218 |
| | | | 257/43 |
| 2016/0218305 A1* | 7/2016 | Kim | G02F 1/133305 |
| 2016/0336523 A1* | 11/2016 | Kwon | H01L 27/3276 |
| 2017/0062760 A1* | 3/2017 | Kim | H01L 51/5253 |
| 2018/0041666 A1* | 2/2018 | Nakayama | H01L 27/14 |
| 2018/0286293 A1* | 10/2018 | Liu | H05K 1/189 |

* cited by examiner

FLEXIBLE DISPLAY APPARATUS HAVING A BENDING AREA CUTOUT

CROSS-REFERENCES TO RELATED APPLICATIONS

This application claims the priority of Chinese Patent Application No. 201711383479.1, filed on Dec. 20, 2017, the entire contents of which are incorporated herein by reference.

FIELD OF THE DISCLOSURE

The present disclosure generally relates to the field of display technology and, more particularly, relates to a flexible display apparatus.

BACKGROUND

With the continuous advancement of the display technology, display panel manufacturing technology has also become more mature. The existing display panels mainly include organic light-emitting diode (OLED) display panels, liquid crystal display (LCD) panels, and plasma display panels (PDP), etc. OLED display apparatus are featured with self-luminous, light weight, thin thickness, wide viewing angle, fast response and high contrast, etc., thereby drawing a lot of attention as next generation display apparatus. Flexible OLED display apparatus having a bending area have been developed, however, the designs of the bending area is desired to be improved.

The disclosed flexible display apparatus is directed to solve one or more problems set forth above and other problems.

BRIEF SUMMARY OF THE DISCLOSURE

One aspect of the present disclosure provides a flexible display apparatus, comprising a flexible substrate including a bending area, an insulating layer formed on the flexible substrate including at least one cutout in the bending area, and a plurality of wires configured in the bending area following a surface shape of the insulating layer. The at least one cutout includes sloped sidewalls protruding away from the flexible substrate.

Other aspects of the present disclosure can be understood by those skilled in the art in light of the description, the claims, and the drawings of the present disclosure.

BRIEF DESCRIPTION OF THE DRAWINGS

To more clearly illustrate the technical solution in the present disclosure, the accompanying drawings used in the description of the disclosed embodiments are briefly described hereinafter. Obviously, the drawings described below are merely some embodiments of the present disclosure. Other drawings may be derived from such drawings by a person with ordinary skill in the art without creative efforts.

DETAILED DESCRIPTION

Figure 1:
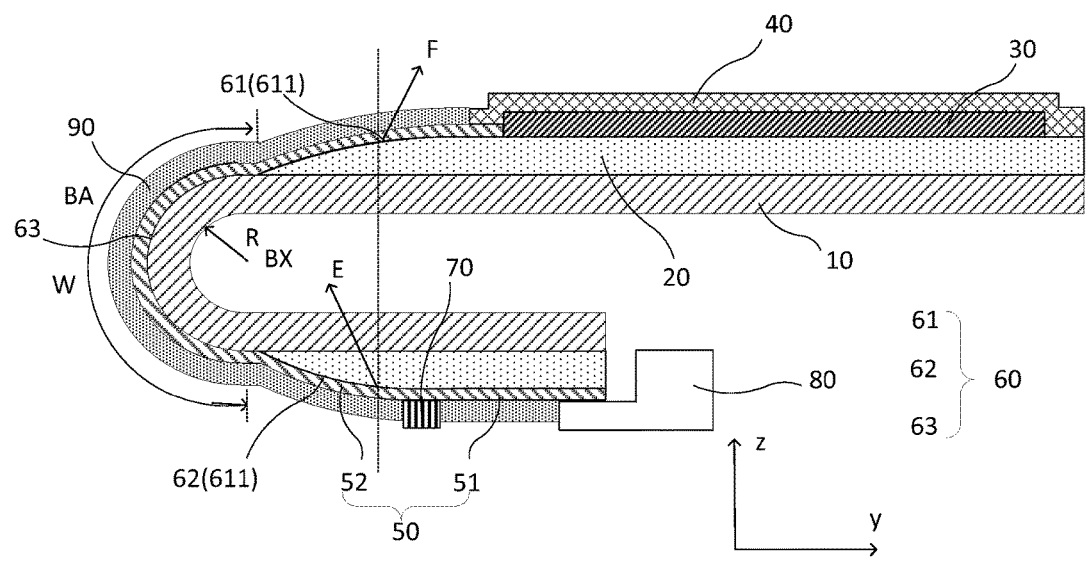
FIG. 1 illustrates a cross-sectional view of an exemplary flexible display apparatus in a bent state according to disclosed embodiments.

To make the foregoing objectives, features and advantages of the present disclosure clearer and more understandable, the present disclosure will be further described with reference to the accompanying drawings and embodiments. However, exemplary embodiments may be embodied in various forms and should not be construed as limited to the embodiments set forth herein. Rather, these embodiments are provided to fully convey the thorough and complete concepts of the exemplary embodiments to those skilled in the art. The same reference labels and numerals in the drawings denote the same or similar structures, and will not be described repetitively. The words and expressions of the positions and directions in the description of the present disclosure are illustrative with the pertaining drawings. However, changes may be made if necessary, and all the changes should be included in the scope of protection of the present disclosure. The drawings of the present disclosure are intended only to illustrate relative position relationship. Thicknesses of layers of certain parts may be enlarged for the convenience of comprehension, and may not represent the proportional relationship of the thicknesses of the actual layers.

It should be noted that the specific details set forth in the following description are intended for those skilled in the art to fully understand the present disclosure. However, the present disclosure may be embodied in various other forms. Those skilled in the art may derive other embodiments without departing from the spirit of the present disclosure. Thus, the present disclosure should not be limited to the disclosed embodiments. When certain terms are used to denote certain structures in the specification and the claims, those skilled in the art should understand that hardware manufacturers may use different terms to refer to the same structures. The specification and the claims may not differentiate the structures according to the terminology difference, but rather, according to the functionality difference. When the specification and the claims use the word "comprising" as an open-ended term, it should be interpreted as "including but not limited to". The following specification describes various preferred embodiments of the present disclosure. However, such description is intended to illustrate the general principles of the present disclosure, and is not intended to limit the scope of the present disclosure. The scope of the present disclosure shall be determined by the appended claims.

FIG. 1 illustrates a cross-sectional view of an exemplary flexible display apparatus in a bent state according to disclosed embodiments. As shown in FIG. 1, the flexible display apparatus may include a flexible substrate 10, and an insulating layer 20 formed on the flexible substrate 10, and a plurality of wires 50. The flexible substrate 10 may include a bending area BA. The insulating layer 20 may include at least one cutout 60 in the bending area BA. The wires 50 may be configured in the bending area BA following a surface shape of the insulating layer 20. The at least one cutout 60 may include sloped sidewalls 611. The sloped sidewalls 611 may protrude away from the flexible substrate 10.

In the disclosed embodiments, the insulating layer 20 may be configured with at least one cutout 60. On one hand, through configuring the cutout 60 at the insulating layer 20, a thickness of the insulating layer 20 may be effectively reduced in the bending area BA, thereby reducing a bending stress of the insulating layer 20, and preventing the insulating layer 20 from being cracked when being bent. On the other hand, because the cutout 60 includes sloped sidewalls 611 and the sloped sidewalls 611 protrude away from the flexible substrate 10, the plurality of wires 50 may be configured following the convex shape of the sloped sidewalls at the cutout 60, thereby preventing the wires from crossing a steep slope due to the presence of the cutout 60 and suppressing the short circuit or open circuit of the wires 50 at the steep slope.

It should be noted that, the steep slope at the cutout 60 may be located at the end of a planarization area A, and an angle between a tangent line passing through the end of the planarization area A and the plane where the flexible substrate 10 is located may be smaller than or equal to about 40°. In one embodiment, in the bending area, when the wires 50 are configured following the surface shape of the insulating layer 20, the thickness of the cutout 60 in the insulating layer 20 may be smaller than or equal to a thickness of the insulating layer 20. That is, in a direction of the thickness of the insulating layer 20, the insulating layer 20 at the cutout 60 may be cut out completely or partially, as long as the cutout 60 includes sloped sidewalls 611 that protrude away from the flexible substrate 10. As such, the bending stress of the insulating layer 20 may be effectively reduced, and short circuits or open circuits of the wires which are configured on the surface of the insulating layer may be prevented.

In one embodiment, as shown in FIG. 1, the depth of the cutout 60 may be equal to the thickness of the insulating layer 20. In the bending area BA, at least a portion of the insulating layer 20 may be cut out completely to effectively reduce the bending stress of the inorganic layer when being bent. In another embodiment, the depth of the cutout 60 may be smaller than the thickness of the insulating layer 20. A corresponding structure is shown in FIG. 2.

Figure 2:
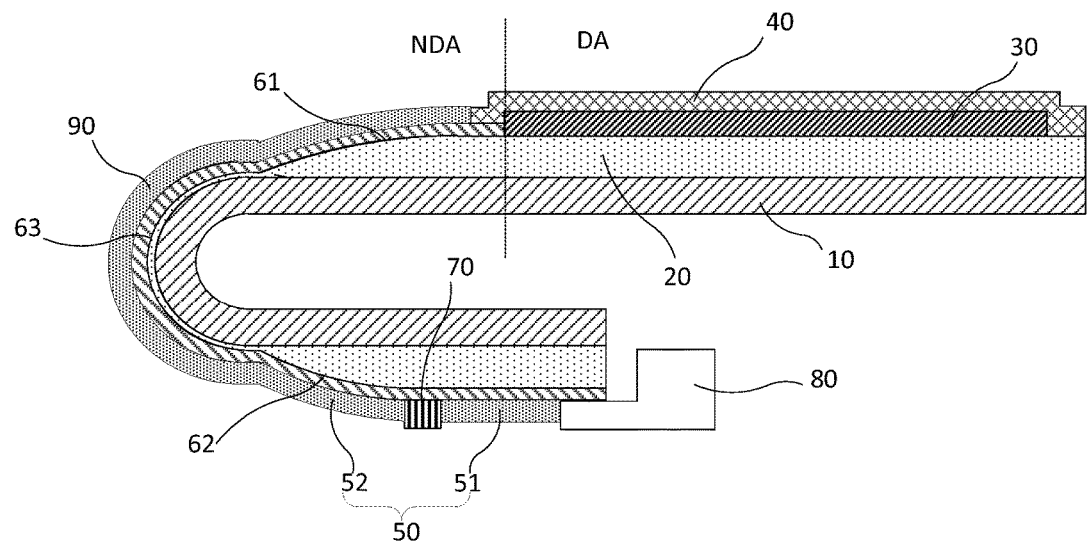
FIG. 2 illustrates a cross-sectional view of another exemplary flexible display apparatus in a bent state according to disclosed embodiments.

FIG. 2 illustrates a cross-sectional view of another exemplary flexible display apparatus in a bent state according to disclosed embodiments. The similarities between FIG. 2 and FIG. 1 are not repeated, while certain difference may be explained.

As shown in FIG. 2, the depth of the cutout 60 may be smaller than the depth of the insulating layer 20. That is, a portion of the inorganic layer may be remained in the bending area BA. The remained inorganic layer may effectively prevent the moisture or oxygen from penetrating from the flexible substrate 10 into the wires 50 or even the display unit, thereby avoiding damages to the wires 50 or the display unit. The remained insulating layer 20 may also prevent ions in the flexible substrate 10 from penetrating the wires 50. Accordingly, the signal transmission of the wires 50 may be prevented from being affected by the ions.

It should be noted that, the flexible substrate 10 may include any appropriate materials having flexible or bendable properties. For example, the flexible substrate 10 may include at least one of polymer resin, such as polyethersulfone (PES), polypropylene resin (PAP), polyetherimide (PEI), polyethylene naphthalate (PEN), polyethylene terephthelate (PET), polyphenylene sulfide (PPS), polyallylate, polyimide (PI), polycarbonate (PC) and cellulose acetate propionate (CAP).

It should be noted that, except for the cutout 60, the insulating layer 20 may be a planarization area. The planarization area may not have an absolute geometric flatness i.e., allowing fluctuations in the fabrication process.

Figure 3:
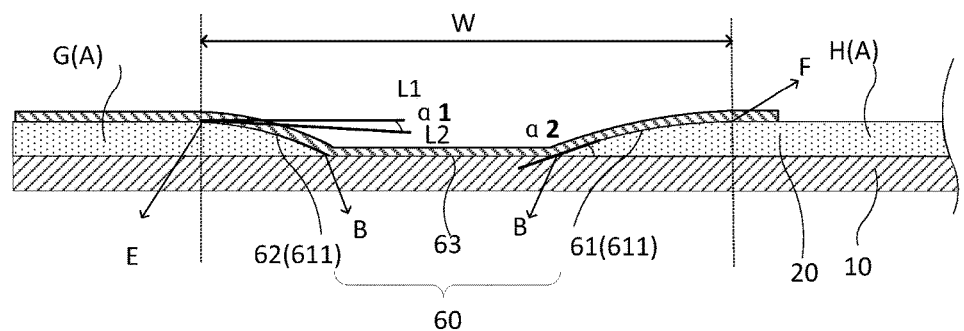
FIG. 3 illustrates a cross-sectional view of an exemplary bending area of an exemplary flexible display apparatus according to disclosed embodiments.

FIG. 3 illustrates a cross-sectional view of an exemplary bending area of an exemplary flexible display apparatus according to disclosed embodiments. For illustrative purposes, only certain layers are shown in the cross-sectional view.

As shown in FIG. 3, the sloped sidewall 611 may protrude away from the flexible substrate 10. The sloped sidewalls 611 may have an end E and an end F adjacent to the planarization area A. In particular, the first sidewall 61 may include the first end E approaching a starting end of the bending area, and the second sidewall 62 may include the second end F departing from the starting end of the bending area. Taking the end E for example, a tangent line L1 passing through the end E may divide the cross-sectional plane of the insulating layer 20 into two sides. The sloped sidewall 62 where the end E is located, as well as, the planarization area G connecting to the sloped sidewall 62, are on a same side of the tangent line L1. A tangent line passing through any point on the sloped sidewall 611 may form an angle $\alpha 1$ smaller than about 45° with respect to the plane where the flexible substrate 10 is located, such that the insulating layer 20 may smoothly transition from the planarization area to the bottom of the cutout 60 and, accordingly, the short circuits or open circuits of the wires 50 may be suppressed.

In the disclosed embodiments, the sloped sidewalls 611 may protrude away from the flexible substrate 10. When the wires 50 extend from the planarization area to the cutout 60, any wire damages due to the presence of any steep slope or sharp corner may be prevented.

In one embodiment, in the non-display area NDA, the insulating layer 20 and the plurality of the wires 50 may be covered by a passivation layer 90. The passivation layer 90 may be an organic layer. Thus, the plurality of the wires 50 may be protected by the passivation layer 90 and, accordingly, the signal transmission of the wires 50 may be prevented from being affected by outside air and oxygen. Further, the bending performance of the bending area may be improved, and the peeling or separation between the wires 50 and the passivation layer 90 may be suppressed when being bent.

Figure 4:
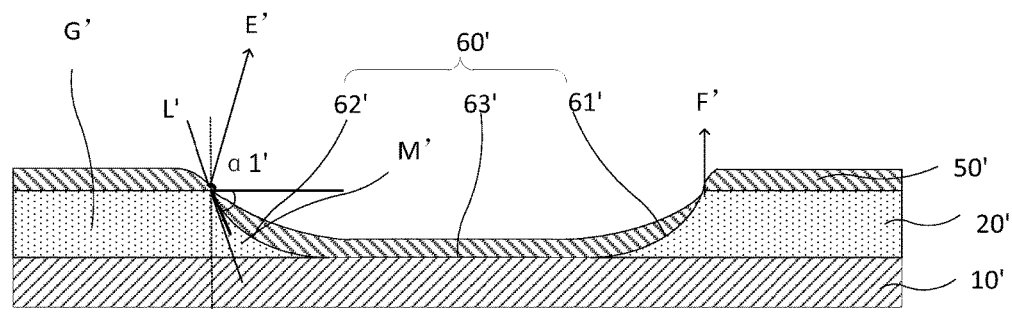
FIG. 4 illustrates a cross-sectional view of a bending area of a comparative flexible display apparatus.

FIG. 4 illustrates a cross-sectional view of a bending area of a comparative flexible display apparatus. The similarities between FIG. 4 and FIG. 3 are not repeated, while certain difference may be explained. For illustrative purposes, only certain layers may be shown in the cross-sectional view.

As shown in FIG. 4, the flexible display apparatus may include an insulating layer 20' and a plurality of wires 50'. The insulating layer 20' may include a cutout 60'. The cutout 60' may include sloped sidewalls 61' and 62'. The sloped sidewalls 61' and 62' may protrude toward the flexible substrate 10' to form a concave shape with respect to the flexible substrate 10'. Except for the cutout 60', the insulating layer 20' may be a planarization area, for example, a planarization area G'.

Taking the sloped sidewall 62' for an example, the cutout 60 may have an end E' and an end F'. Taking the end E' for an example, as shown in FIG. 4, a tangent line L' passing through the end E' may divide the cross-sectional plane of the insulating layer 20' into two sides. A portion M' of the sloped sidewall 62' where the end E' is located is on one side of the tangent line L', and the planarization area G' connecting to the sloped sidewall 62' is on the other side of the tangent line L'. That is, the portion M' of the sloped sidewall 62' where the end E' is located and the planarization area G' connecting to the sloped sidewall 62' are located on different sides of the tangent line L'.

As shown in FIG. 4, the sidewalls 61' and 62' may protrude toward the flexible substrate 10'. Thus, a tangent line passing through any point on the sloped sidewalls 611 near the one of the two ends E' and F' may form a substantially large angle $\alpha 1'$ greater than about $40°$ with respect to the plane where the flexible substrate 10' is located, and the wires 50' may have sharp corners at the end E' and the end F' of the cutout 60'. Short circuits or open circuits of the wires 50' may be likely to occur at the sharp corners at the end E' and the end F'. When the display panel is being bent, cracks may be likely to occur at the end E' and the end F', thereby affecting the signal transmission of the wires 50'.

Figure 5:
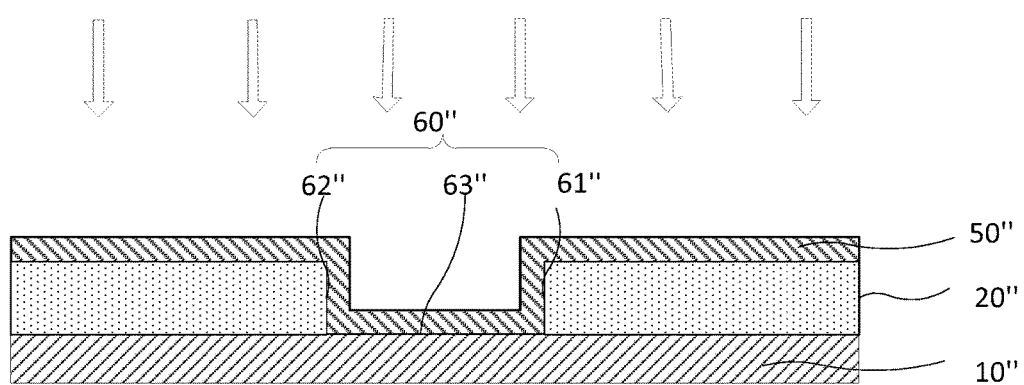
FIG. 5 illustrates a cross-sectional view of a bending area of another comparative flexible display apparatus.
Figure 6:
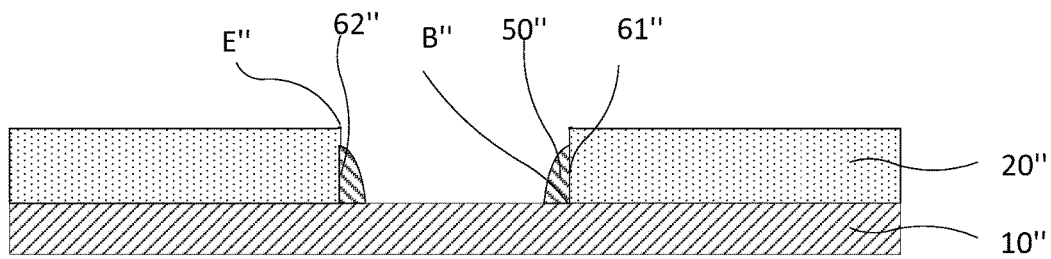
FIG. 6 illustrates a cross-sectional view of a bending area of another comparative flexible display apparatus in FIG. 5.
Figure 7:
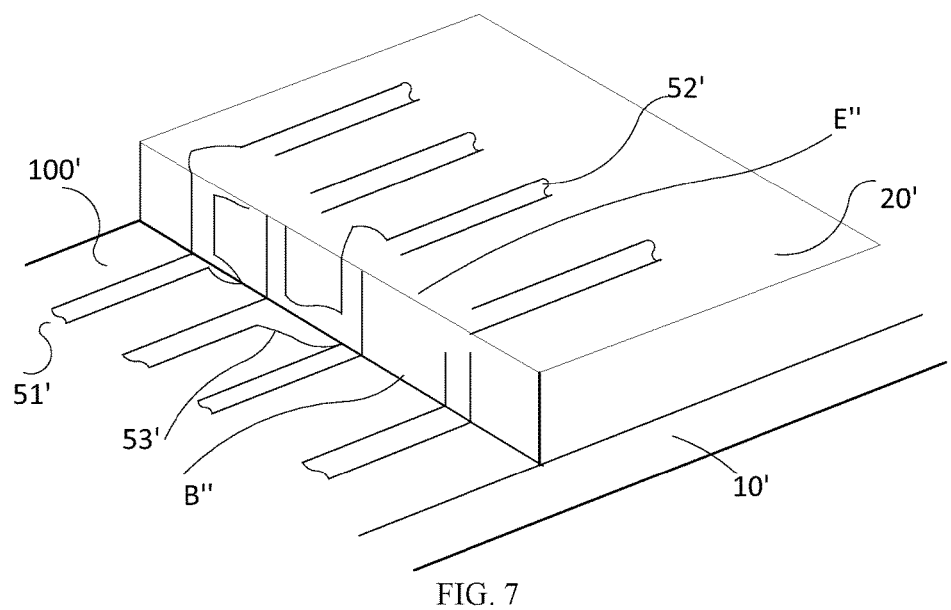
FIG. 7 illustrates a partial top view of a bending area of another comparative flexible display apparatus in FIG. 5.

FIG. 5 illustrates a cross-sectional view of a bending area of another comparative flexible display apparatus. FIG. 6 illustrates a cross-sectional view of a bending area of another comparative flexible display apparatus in FIG. 5. FIG. 7 illustrates a partial top view of a bending area of another comparative flexible display apparatus in FIG. 5. For illustrative purposes, only certain layers may be shown in the cross-sectional view in FIG. 5. and FIG. 6.

As shown in FIG. 5, the flexible display apparatus may include an insulating layer 20", a flexible substrate 10", and a plurality of wires 50". The insulating layer 20" may include a cutout 60". The cutout 60" may include vertical sidewalls 61" and 62". The plurality of the wires 50" may be deposited on the insulating layer 20" to form a photoresist mask (not shown in FIG. 5). When a wiring layer 50" is partially removed by dry etching, a certain portion of the wiring layer 50" may not be removed and may remain around the vertical sidewalls 61" and 62". As shown in FIG. 6 and FIG. 7, the certain portion of the wiring layer 50" may not be removed and may be located at the bottom of the vertical sidewalls. Accordingly, adjacent wires may be short-circuited at the bottom of the insulating layer 20".

In addition, because the wires 50" at the top end E" of the vertical sidewalls of the cutout 60" have to cross over steep slope or sharp corner, the wires 50" may be broken at the top end E" of the vertical sidewalls. As shown in FIG. 7, the wires may be broken at the top end E" of the vertical sidewalls, thereby affecting the signal transmission of the wires 50". At the bottom end B" of the vertical sidewalls, a certain portion of the wiring layer 53" may not be removed, thereby causing short circuits between adjacent wires.

Figure 8:
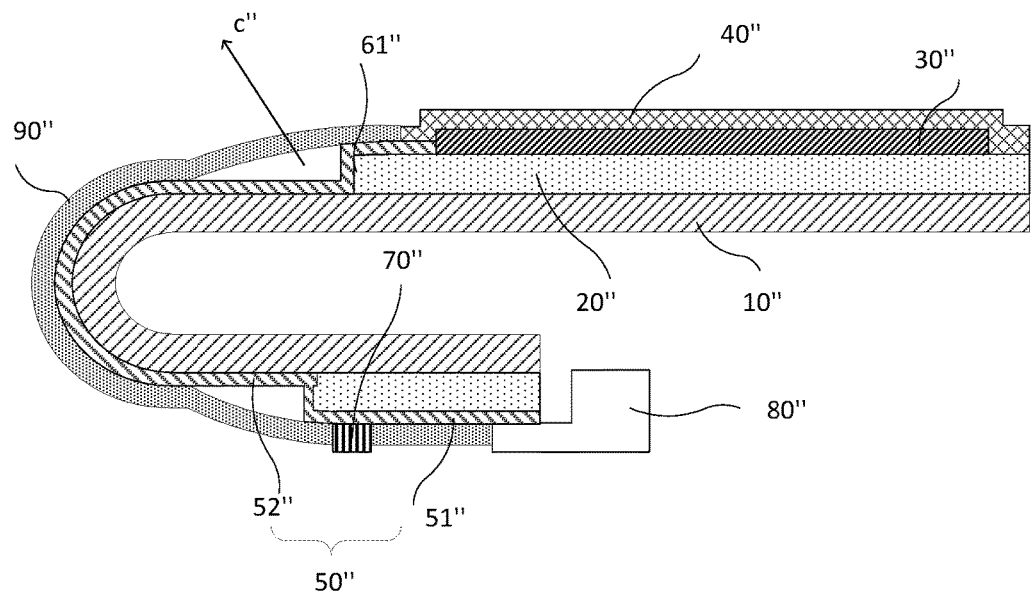
FIG. 8 illustrates a cross-sectional view of a comparative flexible display apparatus in a bent state.

FIG. 8 illustrates a cross-sectional view of a comparable flexible display apparatus in a bent state. As shown in FIG. 8, the insulating layer 20" may include a cutout. The cutout may include vertical sidewalls 61". In the bending area, wires 50" may be formed following a surface shape of the insulating layer 20". The insulating layer 20" and the wires 50" may be covered by a passivation layer 90" formed of an organic material. When the display panel is bent, the passivation layer 90" may be peeled or separated due to the steep slope of the vertical sidewalls 61" of the cutout. For example, a portion of the passivation layer 90" may be separated from the insulating layer 20" and the plurality of the wires 50", as indicated by an arrow C" in FIG. 8. The passivation layer 90" may mainly protect the wires 50" from the erosion caused by outside moisture and oxygen. Outside moisture and oxygen may likely penetrate into the gap indicated by the arrow C" under the separated passivation layer 90" to erode the wires 50", thereby affecting the normal function of the wires 50".

Compared to the comparable examples, in the disclosed embodiments, the sloped sidewalls 611 may protrude away from the flexible substrate 10 to prevent the wires 50 from crossing over steep slope or sharp corner, such that the wires 50 in the bending area BA may be unlikely to be broken, or wiring layer residuals between adjacent wires 50 may be unlikely to occur at the bottom surface 63 of the cutout 60 to cause short circuits between adjacent wires 50. Moreover, when being bent, the passivation layer 90 and the wires 50 may be tightly bonded together, thereby effectively protecting the wires 50 from the erosion caused by outside moisture and oxygen.

Figure 9:
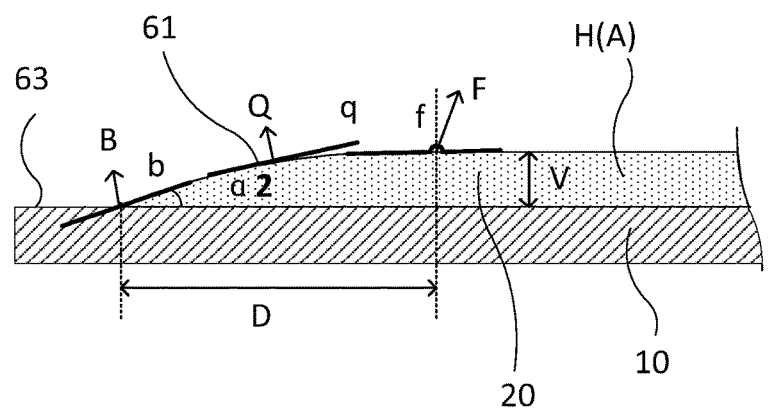
FIG. 9 illustrates an enlarged view of a sloped sidewall 61 in FIG. 3.

In one embodiment, a tangent line passing through any point of the surface of the sloped sidewalls 61 or 62 may divide a cross-sectional plane of the flexible display apparatus into two sides, wherein the cross-sectional plane of the flexible display apparatus includes the tangent line. The entire sloped sidewall where the tangent point of the tangent line is located may be on a same side of the tangent line. FIG. 9 illustrates an enlarged view of a sloped sidewall 61 in FIG. 3. For illustrative purposes, as shown in FIG. 9, an end F of the sloped sidewall 61 closer to a planarization area H, an end B of the sloped sidewall 61 far away from the planarization area H, a point Q between the end F and the end B may be used as tangent points. A tangent line b may pass through the end B, a tangent line f may pass through the end F, and a tangent line q may pass through the point Q.

As shown in FIG. 9, the sloped sidewall 61 may be located on a same side of the tangent line b, the tangent line q and the tangent line f, respectively. In one embodiment, the sloped sidewall 61 may include neither sharp corner that likely causes an open circuit nor vertical sidewall that likely causes a short circuit between adjacent wires at the bottom of the cutout 60. The passivation layer 90 may bond to the wires 50 tightly. When being bent, the passivation layer 90 may not be separated from the wires 50.

In one embodiment, referring to FTG. 3 and FIG. 9, the sidewalls 611 may include a first sidewall 61 and a second sidewall 62 that are separated from each other. A bottom surface 63 of at least one cutout 60 may be configured between the first sidewall 61 and the second sidewall 62. In a direction far away from the bottom surface 63, an angle formed between a tangent line passing through any point on the first sidewall 61 and a plane where the flexible substrate 10 is located may decrease gradually, and an angle formed between a tangent line passing through any point on the second sidewall 62 and a plane where the flexible substrate 10 is located may decrease gradually.

As shown in FIG. 9, the end B, the point Q, and the end F may be sequentially arranged on the sloped sidewall 61 in a direction far away from the bottom surface 63. Angles formed between the tangent line b, the tangent line q, and the tangent line f and the plane where the flexible substrate 10 is located may decrease gradually. That is, the angle formed between the tangent line q and the plane where the flexible substrate 10 is located may be smaller than the angle formed between the tangent line b and the plane where the flexible substrate 10 is located, and the angle formed between the tangent line f and the plane where the flexible substrate 10 is located may be smaller than the angle formed between the tangent line q and the plane where the flexible substrate 10 is located.

In one embodiment, the angle formed between the tangent line f passing through the end F and the plane where the flexible substrate is located may be smaller than or equal to 40°. The insulating layer 20 may be formed by a chemical vapor deposition process. A mask may be configured over an area corresponding to the cutout 60. A shadow effect may occur in the periphery surrounding the mask, which may allow a portion of the insulating layer to be formed around the cutout 60 area. Thus, an angle formed between a tangent line passing through an end point of the cutout 60 in the insulating layer 20 adjacent to the planarization area and the plane where the flexible substrate is located may be smaller than or equal to about 40°.

The process may be different from the process of forming the cutout through etching the insulating layer through a mask. As shown in FIG. 4, the sloped sidewall 62' of the cutout 60' may be formed by etching the insulating layer 20' through a mask. The tangent line L' passing through the E' end of the sloped sidewall 62' may divide the cross-sectional plane of the sloped sidewall 62' into two sides. The portion M' of the sloped sidewall 62' and the planarization area G' may be located on different sides of the tangent line L'. As shown in FIG. 4, the sidewalls 61' and 62' may protrude toward the flexible substrate 10', such that the angle (α1' as shown in FIG. 4) formed between the tangent line passing through the end of the cutout 60' adjacent to the planarization area and the plane where the flexible substrate 10' is located may be substantially large and greater than about 40°. The cutout formed by etching the photoresist through a mask may include steep slope or sharp corner at both ends of the cutout. Short circuits or open circuits of the wires 50 may occur at the steep slopes or the sharp corners.

In the other embodiments, the angle formed between the tangent line f passing through the end F and the plane where the flexible substrate 10 is located may be about 0°, such that the insulating layer 20 may smoothly transit from the planarization area H to the cutout, without forming any steep slope or sharp corner. The wires may be arranged on the sloped sidewall 61 in a desired way, such that no short circuits or open circuits may occur. In addition, in the direction far away from the bottom surface 63, the angle, which is formed between the tangent line passing through any point on the surface of the first sloped sidewall 61 and the plane where the flexible substrate 10 is located, may decrease gradually, and the angle, which is formed between the tangent line passing through any point on the surface of the second sloped sidewall 62 and the plane where the flexible substrate 10 is located, may decrease gradually. Thus, the sloped sidewalls 61 and 62 each may have a smooth convex shape that protrudes away from the flexible substrate 10. Accordingly, the bending stress may be distributed uniformly on the surface of the sloped sidewalls, thereby preventing excessive bending stress from being concentrated on any single point and suppressing cracks on the single point.

Figure 10:
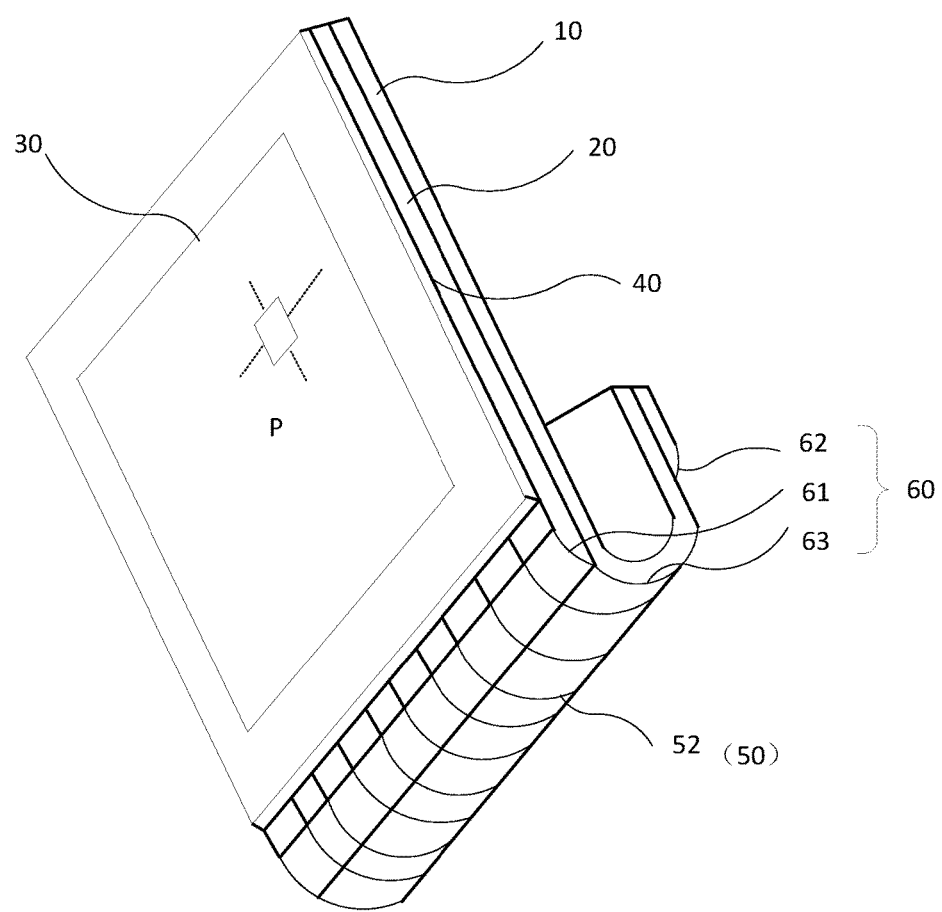
FIG. 10 illustrates a perspective view of an exemplary flexible display apparatus in a folded state according to disclosed embodiments.

FIG. 10 illustrates a perspective view of an exemplary flexible display apparatus in a folded state according to disclosed embodiments. As shown in FIG. 10, the flexible display apparatus may include a flexible substrate 10 and a display unit 30. The display unit 30 may include a plurality of pixels P. For example, the plurality of the pixels P may include red pixels, green pixels, and blue pixels. The red pixels, the green pixels, and the blue pixels may be combined to display images. Each pixel P may include a pixel circuit and an organic light-emitting diode. The pixel circuit may include at least two thin-film-transistors and at least one storage capacitor, and the pixel circuit may control the organic light-emitting diode to emit light.

Figure 11:
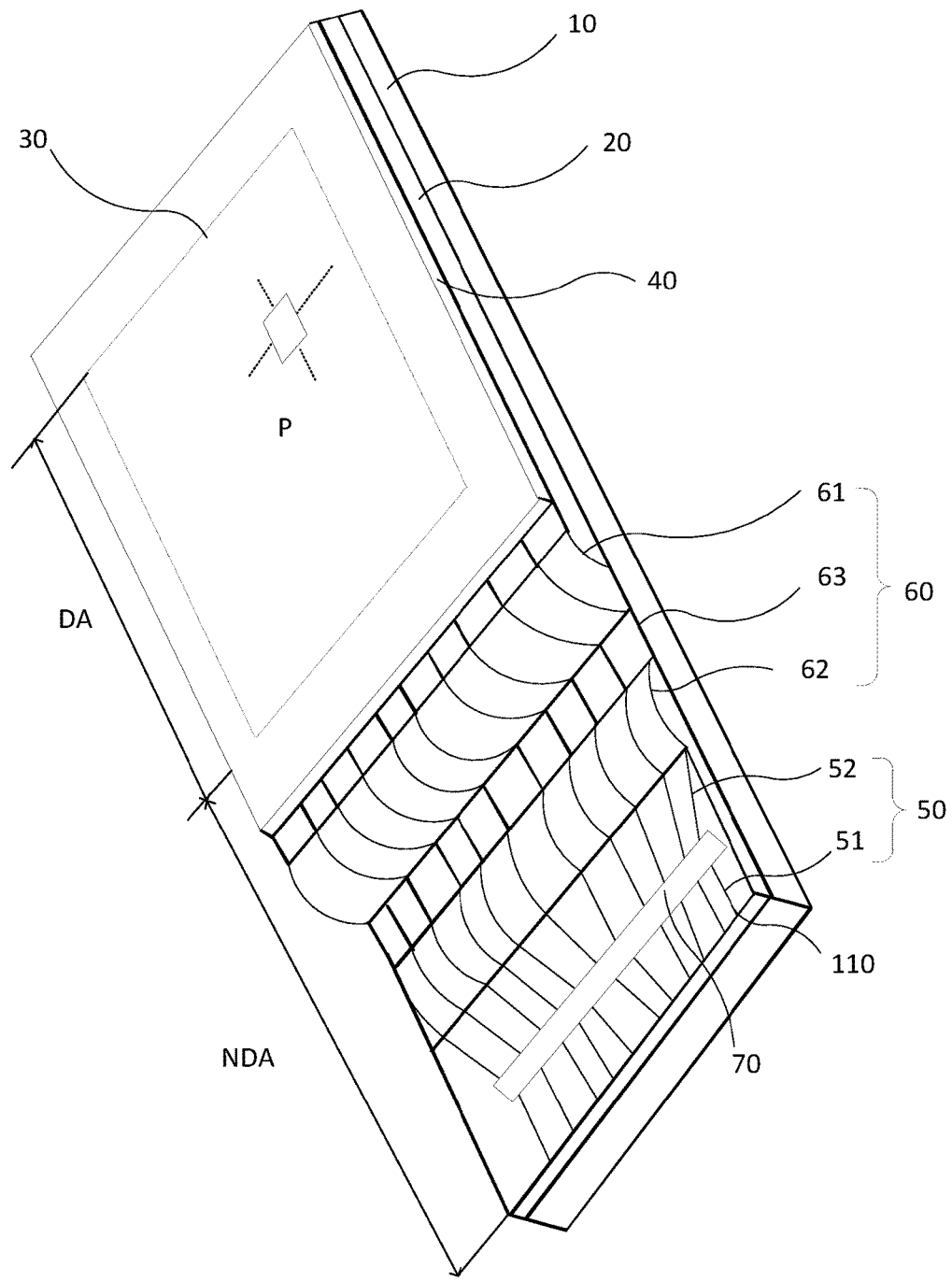
FIG. 11 illustrates a perspective view of an exemplary flexible display apparatus in FIG. 10 in an unfolded state.

FIG. 11 illustrates a perspective view of the exemplary flexible display apparatus in FIG. 10 in an unfolded state. As shown in FIG. 11, the flexible substrate 10 may include a display area DA and a non-display area NDA. A display unit may be configured in the display area DA. The non-display area NDA of the flexible substrate 10 may include a plurality of pad electrodes 110 and a plurality of wires 50. The plurality of the pad electrodes 110 may be formed in the periphery of the flexible substrate 10. The plurality of the wires 50 and the plurality of the pad electrodes 110 may be electrically connected to a plurality of signal lines formed in the display unit 30. The plurality of signal lines may include scanning lines, data lines, and driving voltage lines, etc. The plurality of the pad electrodes 110 may be electrically connected to output lines of a driver 80. The driver 80 may supply power to the display and output various signals to the pad electrodes 110.

A driving integrated circuit 70 may be mounted in the non-display area NDA of the flexible substrate 10. The driving integrated circuit 70 may be mounted on the flexible substrate 10 by using an anisotropic conductive film in a form of plastic chip. The driving integrated circuit 70 may be a data line driver, which is for illustrative purposes and is not intended to limit the scope of the present disclosure.

When the driving integrated circuit 70 is mounted on the flexible substrate 10, the plurality of the wires 50 may be divided into a plurality of input wires 51 connected to the plurality of the pad electrodes 110 and the driving integrated circuit 70, and a plurality of output wires 52 connected to the driving integrated circuit 70 and the display unit 30.

Referring to FIG. 11, when the non-display area NDA is configured in parallel with the display area DA, the non-display space in the periphery of the display unit 30 may increase. Referring to FIG. 11, to reduce the bezel size and improve visual effect, the bending area BA may be included inside the non-display area NDA. The bending area BA may be bent around a bending axis BX, and the bending axis BX may be parallel to an x axis (not shown in FIG. 11).

The bending area BA may be an area between the display unit 30 and the driving integrated circuit 70 in the non-display area NDA, for example, an area configured with the plurality of the output wires 52. When the flexible display apparatus is being bent in the bending area BA, the driving integrated circuit 70 and the plurality of the pad electrodes 110 may overlap with the back of the display unit 30. The flexible display apparatus provided by the disclosed embodiments may be bent in the bending area BA to minimize the non-display area in the periphery of the display unit 30 to improve visual effect.

Figure 12:
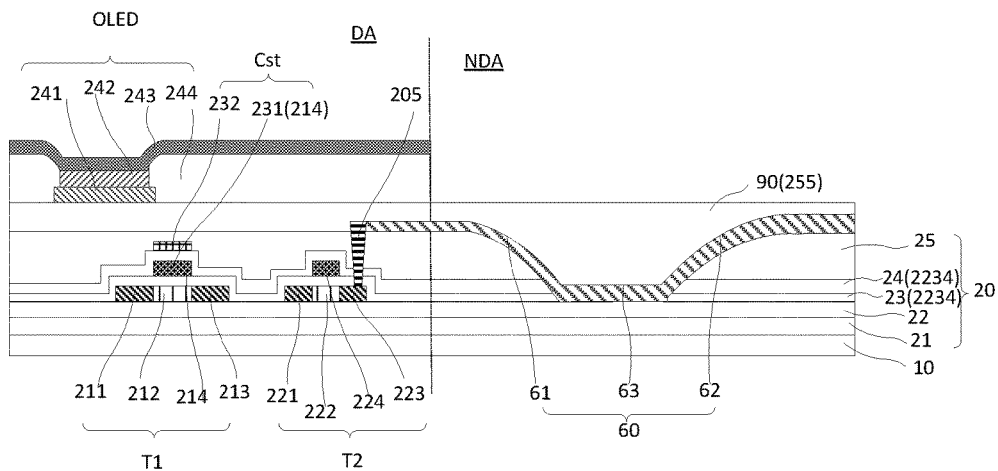
FIG. 12 illustrates an enlarged cross-sectional view of an exemplary display area and an exemplary non-display area according to disclosed embodiments.

The structure of the display unit 30 may be described below. FIG. 12 illustrates an enlarged cross-sectional view of an exemplary display area and an exemplary non-display area according to disclosed embodiments. In one embodiment, as shown in FIG. 12, the display unit 30 may include a driving transistor T1, a switching transistor T2, a storage capacitor Cst, and an organic light-emitting diode (OLED). A barrier layer 21 and a buffer layer 22 may be formed sequentially on the flexible substrate 10. During a crystallization process of forming polysilicon (semiconductor), impurities may exist in the flexible substrate 10. The barrier layer 21 and the buffer layer 22 may prevent the impurities from penetrating into the polysilicon. The barrier layer 21 may include multiple layers made of silicon oxide and silicon nitride. The buffer layer 22 may include a single layer made of silicon oxide and silicon nitride. It should be noted that the barrier layer 21 and the buffer layer 22 may be configured on the flexible substrate 10 as shown in FIG. 12. In the other embodiments, neither the barrier layer 21 nor the buffer layer 22 may be configured on the flexible substrate 10, or only one of the barrier layer 21 and the buffer layer 22 may be configured on the flexible substrate 10, which are intended to be illustrative and shall not limit the scope of the present disclosure.

A semiconductor of a driving channel 212 and a switching channel 222 may be formed on the buffer layer 22. A driving source electrode 213 and a driving drain electrode 211 may be formed on both sides of the driving channel 212, and may contact the driving channel 212. A switching source electrode 223 and a switching drain electrode 221 may be formed on both sides of the switching channel 222, and may contact the switching channel 222.

A gate insulating layer 2234 may be formed on the semiconductor. For illustrative purposes, FIG. 12 illustrates a first gate insulating layer 23 and a second gate insulating layer 24. The first gate insulating layer 23 may be formed on the semiconductor. A driving gate electrode 214 and a switching gate electrode 224 may be configured on the first gate insulating layer 23. The second insulating layer 24 may be formed on the driving gate electrode 214 and the switching gate electrode 224. A second storage electrode 232 of the storage capacitor Cst may be configured on the second gate insulating layer 24. The first gate insulating layer 23 and the second gate insulating layer 24 may be made of silicon oxide and silicon nitride, etc.

The storage capacitor Cst may include a storage electrode 231 and a second storage electrode 232. The second gate insulating layer 24 may be configured between the first storage electrode 231 and the second storage electrode 232. The first storage electrode 231 may be configured corresponding to the driving gate electrode 214. The second gate insulating layer 24 may be made of a dielectric material. The capacitance of the storage capacitor Cst may be determined by an electric charge held in the storage capacitor Cst and a voltage applied between the first storage electrode 231 and the second storage electrode 232.

The driving transistor T1, the switching transistor T2, and the storage capacitor Cst may be covered by an inter-layer insulating layer 25. A data line 205 may be configured on the inter-layer insulating layer 25. The data line 205 may be connected to the source electrode 223 of the switching transistor T2 by through-holes formed in the inter-layer insulating layer 25, the first gate insulating layer 23, and the second gate insulating layer 24.

The data line 205 may be covered by a planarization layer 255. An organic light-emitting diode (OLED) may be formed on the planarization layer 255. The organic light-emitting diode (OLED) may include at least an anode 241, a light-emitting pixel 242, and a cathode 243 configured on a side of the light-emitting pixel 242 far away from the anode 241 and contacting the light-emitting pixel 242. A pixel defining layer 244 may be configured between adjacent light-emitting pixels 242 to define a light-emitting area for each light-emitting pixel 242. The pixel defining layer 244 may be made of polyacrylic resin, polyimide resin, or a silica-based inorganic material. The organic light-emitting diode may further include one or more of a hole injection layer, a hole transport layer, an electron barrier layer, a hole barrier layer, an electron transport layer, and an electron injection layer. The hole injection layer and/or the hole transport layer may be configured between the anode 241 and the light-emitting pixel 242. The hole injection layer, the hole transport layer, the electron transport layer, and the electron injection layer may be formed in the entire display area on the flexible substrate 10.

It should be noted that the anode 241 may have a top emitting structure, such as ITO—Ag—ITO (e.g., indium tin oxide-silver-indium tin oxide). The anode 241 may effectively reflect light emitted from the light-emitting pixel layer toward a light-emitting side to improve light-emitting efficiency. Holes injected from the anode 241 and electrons injected from the cathode 243 may be recombined in the light-emitting pixel 242 to generate excitons. The excitons may fall from an excited state to a ground state to emit light.

Referring to FIG. 1, the display unit 30 may be encapsulated by an encapsulation layer 40. The encapsulation layer 40 may include at least one organic encapsulation layer and at least one inorganic encapsulation layer. The organic encapsulation layer may include a single layer or stacked layers made of a polymer, such as polyethylene terephthalate, polyimide, polycarbonate, epoxy, polyethylene, polyacrylate, or organosiloxane, etc. The inorganic encapsulation layer may include a single layer or stacked layers made of metal oxide, non-metal oxide, or nitride. For example, the inorganic encapsulation layer may be made of one or a combination of $SiN_x$ (silicon nitride), $Al_2O_3$ (alumina), $SiO_2$ (silicon oxide), $SiO_xN_y$ (silicon oxynitride), and $TiO_2$ (titania). Specific material and structure of the encapsulation layer 40 are intended to be illustrative and not to limit the scope of the present disclosure.

The insulating layer 20 may include at least one inorganic layer stacked on the flexible substrate 10, and the at least one inorganic layer may include a couple of inorganic film layers. At least one cutout 60 may be at least configured in an outermost film layer of the at least one inorganic layer. In one embodiment, the insulating layer 20 may include at least one of the gate insulating layer 2234 and the inter-layer insulating layer 25.

In another embodiment, the insulating layer 20 may include at least one of the barrier layer 21, the buffer layer 22, the gate insulating layer 2234, and the inter-layer insulating layer 25. The gate insulating layer 2234 may include the first gate insulating layer 23 and the second gate insulating layer 24.

In another embodiment, the insulating layer 20 may include the barrier layer 21, the buffer layer 22, the first gate insulating layer 23, the second gate insulating layer 24, and the inter-layer insulating layer 25. The cutout 60 may be formed in the inter-layer insulating layer 25, or in the inter-layer insulating layer 25 and the second gate insulating layer 24, or in the inter-layer insulating layer 25, the second gate insulating layer 24, and the first gate insulating layer 23, or in the inter-layer insulating layer 25, the second gate insulating layer 24, the first gate insulating layer 23, and the buffer layer 22, or in the inter-layer insulating layer 25, the second gate insulating layer 24, the first gate insulating layer 23, the buffer layer 22, and the barrier layer 21. For illustrative purposes, as shown in FIG. 12, the insulating layer 20 may include the barrier layer 21, the buffer layer 22, the first gate insulating layer 23, the second gate insulating layer 24, and the inter-layer insulating layer 25. The cutout 60 may be formed in the inter-layer insulating layer 25, the second gate insulating layer 24, and the first gate insulating layer 23.

In one embodiment, the insulating layer 20 may include the buffer layer 22, the first gate insulating layer 23, the second gate insulating layer 24, and the inter-layer insulating layer 25. The cutout 60 may be formed in the inter-layer insulating layer 25, or in the inter-layer insulating layer 25 and the second gate insulating layer 24, or in the inter-layer insulating layer 25, the second gate insulating layer 24, and the first gate insulating layer 23, or in the inter-layer insulating layer 25, the second gate insulating layer 24, the first gate insulating layer 23, and the buffer layer 22.

It should be noted that the structures of the insulating layer 20 in various embodiments are intended to be illustrative and not to limit the specific layers included in the insulating layer 20 and where the cutout is located.

Referring to FIG. 9, an orthogonal projection of the sloped sidewall 61 onto the plane where the flexible substrate 10 is located may have a length D, the insulating layer may have a thickness V, and $D/V \geq 2$. When D is too small or V is too large, D/V may be too small, and may affect a smooth transition from the sloped sidewall 61 to the bottom surface 63. Residuals of wires may occur on the bottom surface 63 of the cutout 60, thereby causing short circuits between adjacent wires.

In one embodiment, the thickness V of the insulating layer 20 may be approximately 0.02 μm~2 μm. The length D of the sloped sidewall 61 may be approximately 20 μm~300 μm. Having the thickness V of the insulating layer 20 approximately 0.02 μm~2 μm may protect the wires and the pixel circuits in the display unit, and may prevent ions in the flexible substrate from penetrating into the wires and the pixel circuits, thereby affecting the electrical performance of the wires and the pixel circuits. When the flexible substrate 10 is separated and a laser separation method is used, the insulating layer 20 may prevent the laser from damaging the pixel circuits. When the insulating layer 20 is too thin, the insulating layer 20 may not be able to protect the wires and the pixel circuits. When the insulating layer 20 is too thick, the length D of the sloped sidewall 61 may have to be extended and may add unusable space in the non-display area. When the length D of the sloped sidewall 61 is not sufficiently long, a steep slope may exist at the cutout, thereby resulting in open circuits or short circuits.

Figure 13:
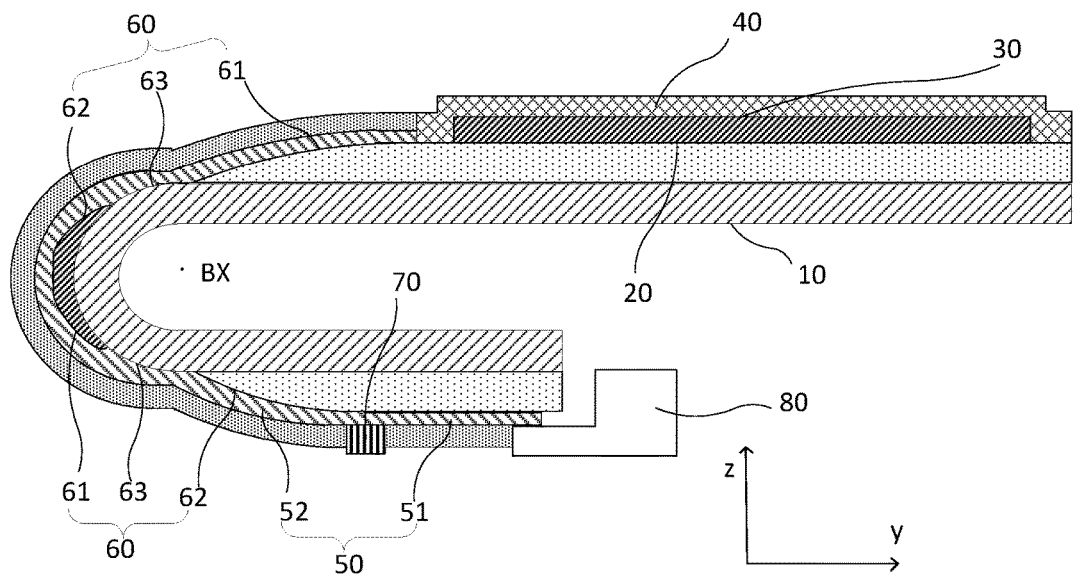
FIG. 13 illustrates a cross-sectional view of another exemplary flexible display apparatus in a bent state according to disclosed embodiments.

FIG. 13 illustrates a cross-sectional view of another exemplary flexible display apparatus in a bent state according to disclosed embodiments. The similarities between FIG. 13 and FIG. 1 are not repeated, while certain difference may be explained. As shown in FIG. 13, the difference may be that the insulating layer 20 in the bending area may include multiple cutouts 60. The cutouts 60 may be distributed separately in a length direction of the plurality of the wires 50. Each of the cutouts 60 may extend in a direction parallel with a bending axis BX. As shown in FIG. 13, the insulating layer 20 may include two cutouts 60. However, the number of the cutouts 60 in the insulating layer 20 is intended to be illustrative and not to limit the scope of the present disclosure. Those skilled in the art may determine the number of the cutouts 60 in the insulating layer 20 based on the actual requirement.

In one embodiment, referring to FIG. 1 and FIG. 13, a width W of the cutout 60 may satisfy $W \geq (n/180°)\pi R$, where R is a bending radius, n is a bending angle of the cutout 60, and $0° < n \leq 180°$. In the bending area, the insulating layer 20 may include at least one cutout 60, such that the insulating layer 20 may be thinner in the bending area, and the bending stress may be minimized when the insulating layer 20 is bent in the bending area. Moreover, when the width W of the cutout 60 satisfies $W \geq (n/180°)\pi R$, the bending stress generated when the bending area is bent may not concentrate on the cutouts 60, thereby alleviating the concentration of the bending stress and partially releasing the bending stress.

In one embodiment, the width W of the cutout 60 may satisfy $W \geq \pi R$. For illustrative purposes, only one cutout 60 is shown in FIG. 1, and the width W of the cutout 60 satisfies $W \geq \pi R$. When the width W of the cutout 60 satisfies $W \geq \pi R$, the end E and the end F of the sloped sidewalls 611 adjacent to the planarization areas may be located outside the bending area BA. The bending stress generated when the bending area is bent may not concentrate at the end E and the end F of the cutout 60, thereby preventing the bending stress generated when the bending area is bent from concentrating on the slope of the cutout 60. Thus, open circuits of the wires 50 on the slope may be prevented. On the other hand, when the width W of the cutout 60 satisfies $W \geq \pi R$, the sloped sidewalls 611 of the cutout 60 may smoothly transit from the planarization areas to the bottom surface of the cutout 60, thereby preventing steep slopes.

In one embodiment, when the sloped sidewalls 611 includes the first sidewall 61 and the second sidewall 62 that are separated from each other, the bottom surface 63 of the at least one cutout 60 may be disposed between the first sidewall 61 and the second sidewall 62. The bottom surface 63 may have a width W2 and $W2 \geq \pi R$, where R is the bending radius. Because the bottom surface 63 between the sloped sidewalls 611 is thin, the bending stress may be small. When the width W2 of the bottom surface 63 satisfies $W2 \geq \pi R$, the sloped sidewalls 611 may be located outside the bending area BA. The bending stress generated when the bending area is bent may not concentrate on the sloped sidewalls or at the end E and the end F of the cutout 60.

Figure 14:
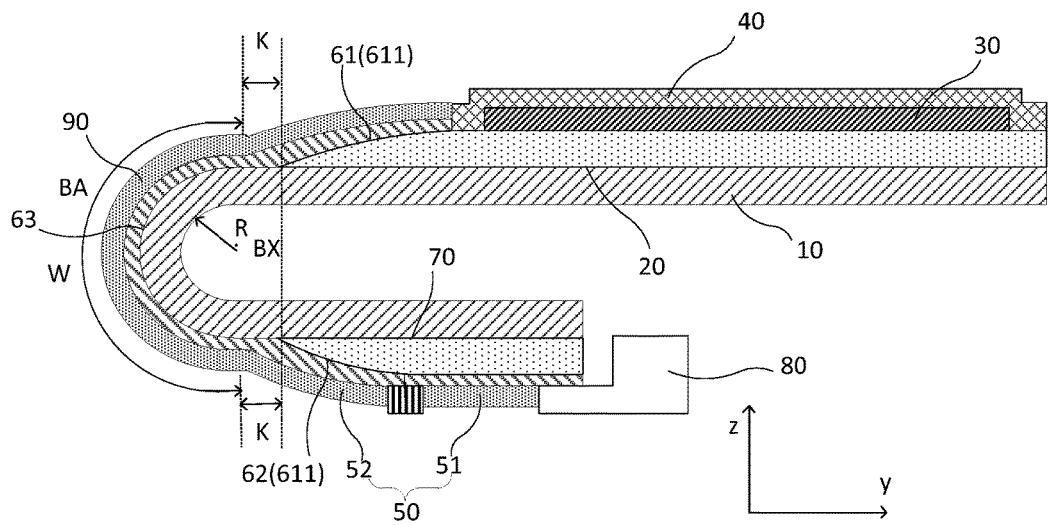
FIG. 14 illustrates a cross-sectional view of another exemplary flexible display apparatus in a bent state according to disclosed embodiments.

FIG. 14 illustrates a cross-sectional view of another exemplary flexible display apparatus in a bent state according to disclosed embodiments. In one embodiment, as shown in FIG. 14, the sloped sidewalls 611 may include a first sidewall 61 and a second sidewall 62 that are separated from each other. A bottom surface 63 of a cutout 60 may be configured between the first sidewall 61 and the second sidewall 62. The bottom surface 63 may be located in the bending area. As shown in FIG. 14, an edge of the insulating layer 20 adjacent to the cutout 60 and a starting end of the bending area BA may be separated by a distance K greater than or equal to about 50 μm. Thus, no insulating layer 20 may exist in the bending area BA, the edges of the insulating layer 20 and the bending area BA may be separated by a certain distance, and the bending stress may be reduced.

Figure 15:
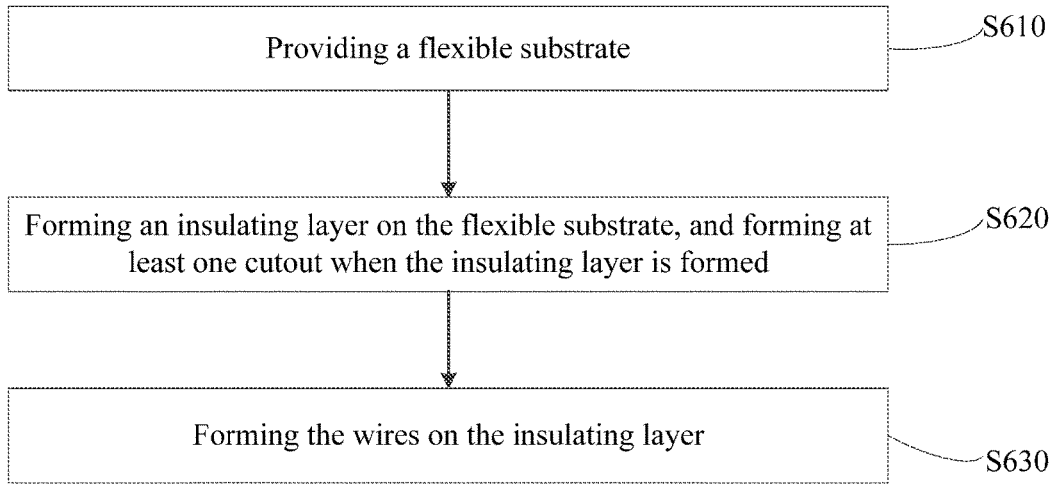
FIG. 15 illustrates a flow chart of an exemplary flexible display apparatus fabrication method according to disclosed embodiments.

The present disclosure also provides a fabrication method for a flexible display apparatus. FIG. 15 illustrates a flow chart of an exemplary flexible display apparatus fabrication method according to disclosed embodiments. FIGS. 16-19 illustrate various cross-sectional views of an exemplary flexible display apparatus in different steps of the fabrication process according to disclosed embodiments. As shown in FIG. 15, the fabrication method may include the following steps.

At the beginning, a flexible substrate is provided (S610). The corresponding structure is shown in FIG. 16.

Figure 16:
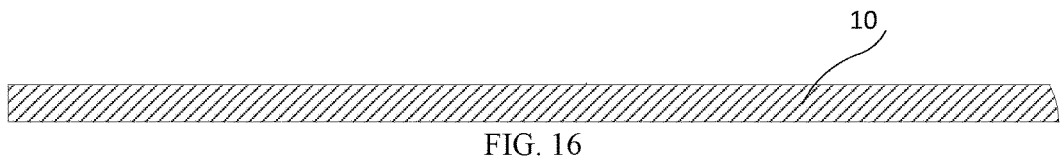
FIG. 16 illustrates a cross-sectional view of an exemplary flexible substrate according to disclosed embodiments.

As shown in FIG. 16, a flexible substrate 10 may be provided.

Returning to FIG. 16, after the flexible substrate is provided, an insulating layer is formed on the flexible substrate and at least one cutout is formed during the formation of the insulating layer(S620). The corresponding structure is shown in FIG. 17.

Figure 17:
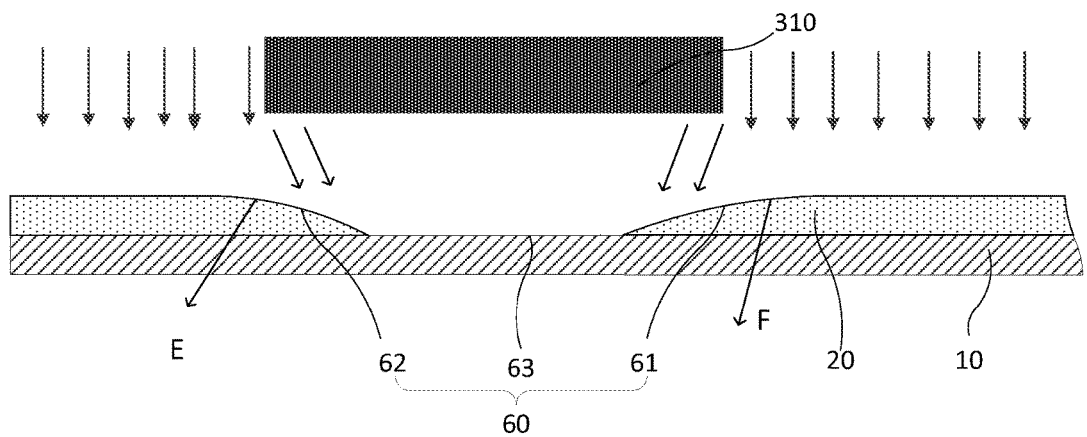
FIG. 17 illustrates a cross-sectional view of an exemplary cutout area formed on an exemplary flexible substrate according to disclosed embodiments.

FIG. 17 illustrates a cross-sectional view of an exemplary cutout area formed on an exemplary flexible substrate according to disclosed embodiments. As shown in FIG. 17, an insulating layer 20 may be formed on the flexible substrate 10. The insulating layer 20 may be formed coplanar with at least one of a first gate insulating layer 23, a second gate insulating layer 24, and an inter-layer insulating layer 25 in a display unit 30. In the other embodiments, the insulating layer 20 may include at least one of a barrier layer 21 and a buffer layer 22 formed on the flexible substrate 10 before the display unit 30 is formed. The insulating layer 20 may be formed by a chemical vapor deposition process.

As shown in FIG. 17, a mask 310 may be configured over an area corresponding to a cutout 60. The insulating layer 20 may be formed in an area that is not covered by the mask 310. A shadow effect may occur in the periphery surrounding the mask 310. Thus, a portion of the insulating layer 20 may be formed around the cutout 60 area, such that sloped sidewalls 61 and 62 that protrude away from the flexible substrate 10 may be formed in the cutout 60. The cutout 60 formed in this way may include a first sidewall 61 and a second sidewall 62 that are separated from each other. A bottom surface 63 of the at least one cutout 60 may be configured between the first sidewall 61 and the second sidewall 62. In a direction far away from the bottom surface 63, an angle formed between a tangent line passing through any point on the surface of the first sidewall 61 and the plane where the flexible substrate is located may decrease gradually. Similarly, an angle formed between a tangent line passing through any point on the surface of the second sidewall 62 and the plane where the flexible substrate is located may decrease gradually.

Further, the first sidewall 61 may include a first end E approaching a starting end of the bending area and the second sidewall 62 may include a second end F departing from the starting end of the bending area. An angle formed between a tangent line passing through the end E and the plane where the flexible substrate 10 is located may be smaller than or equal to about 30°. In the other embodiments, the angle formed between a tangent line passing through the end E and the plane where the flexible substrate 10 is located may be configured to be about 0°, such that the insulating layer 20 may smoothly transit from the planarization areas to the cutout 60 without forming any steep slope or sharp corner. Thus, the wires 50 may be arranged on the sloped sidewalls in a desired way, and no short circuit or open circuit may occur.

In a direction far away from the bottom surface 63, an angle formed between a tangent line passing through any point on the surface of the first sidewall 61 and the plane where the flexible substrate is located may decrease gradually. Similarly, an angle formed between a tangent line passing through any point on the surface of the second sidewall 62 and the plane where the flexible substrate is located may decrease gradually. Thus, a strong bonding may be formed between the plurality of the wires 50 and the insulating layer 20, and no open circuit or short circuit between adjacent wires may occur.

It should be noted that the depth of the cutout 60 and the length of the sloped sidewalls of the cutout 60 may be adjusted by controlling the length and width of the mask 310 and controlling the duration of the chemical vapor deposition. In the other embodiments, through adjusting the width of the mask 310, the first sidewall 61 and the second sidewall 62 of the cutout 60 may touch or overlap with each other at the bottom of the cutout 60.

Returning to FIG. 16, after the insulating layer is formed on the flexible substrate and at least one cutout is formed during the formation of the insulating layer, a plurality of wires are formed on the insulating layer (S630). The corresponding structure is shown in FIG. 18.

Figure 18:
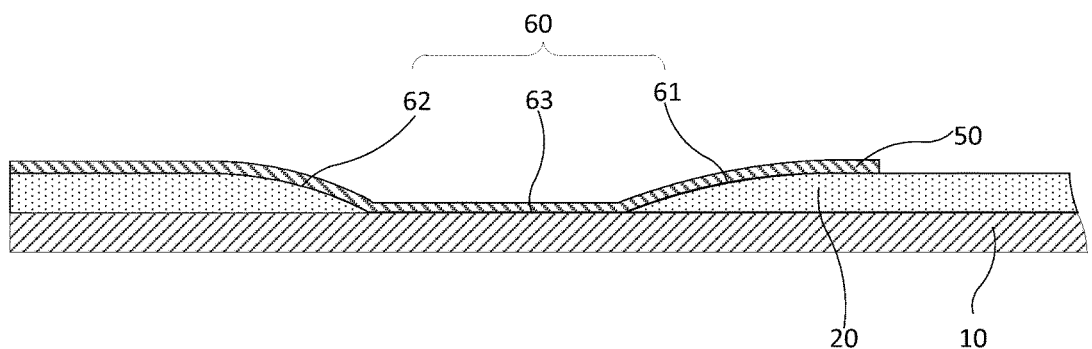
FIG. 18 illustrates a cross-sectional view of an exemplary cutout area having wires formed on an insulating layer according to disclosed embodiments.

FIG. 18 illustrates a cross-sectional view of an exemplary cutout area having wires formed on an insulating layer according to disclosed embodiments. As shown in FIG. 18, a plurality of wires 50 may be formed by a graphic patterning process. Because the sloped sidewalls 61 and 62 of the cutout 60 protrude away from the flexible substrate 10, open circuits at the end of the cutout 60 or metal residuals at the bottom of the cutout 60 causing short circuits between adjacent wires may not occur.

It should be noted that, the flexible substrate 10 may be divided into a display area DA (not shown in FIG. 18) configured with a display unit 30 (not shown in FIG. 18) and a non-display area NDA (not shown in FIG. 18) surrounding the display area DA. The insulating layer 20 may be formed in both the display area DA and the non-display area NDA. A plurality of transistors and storage capacitors (not shown in FIG. 18) may be formed when the insulating layer 20 is formed.

Figure 19:
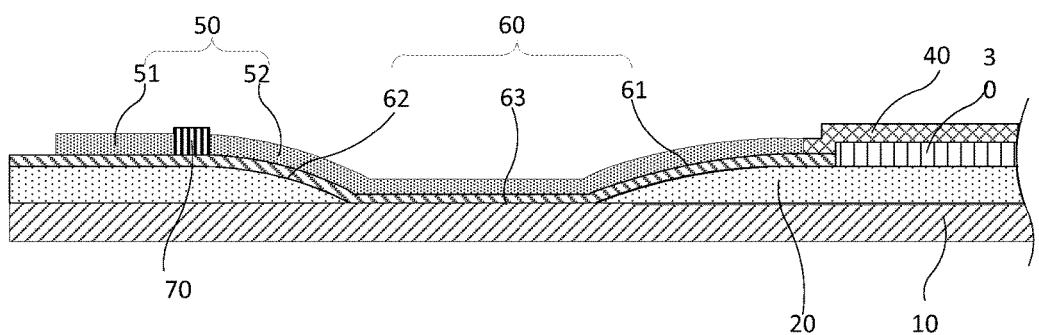
FIG. 19 illustrates a cross-sectional view of an exemplary flexible display apparatus in an unbent state according to disclosed embodiments.

FIG. 19 illustrates a cross-sectional view of an exemplary flexible display apparatus in an unbent state according to disclosed embodiments. As shown in FIG. 19, a driving integrated circuit 70 may be mounted in the non-display area NDA. A passivation layer (not shown in FIG. 19) may be formed in the entire non-display area NDA. Because the sloped sidewalls 61 and 62 that protrude away from the flexible substrate 10 are formed in the cutout 60, the passivation layer may be bonded sufficiently strong to the wires 50. When the flexible display apparatus is bent, the passivation layer and the wires 50 may not be separated.

The flexible display apparatus provided by the embodiments of the present disclosure includes an insulating layer. The insulating layer includes at least one cutout in the bending area. The cutout includes sloped sidewalls protruding away from the flexible substrate. On one hand, the sidewalls reduce the thickness of the insulating layer in the bending area, reduce the bending stress of the insulating layer, and lower the probability of cracking of the insulating layer when being bent. On the other hand, the sloped sidewalls prevent occurrences of short circuit or open circuit of the wires at the cutout position.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A flexible display apparatus, comprising:
    a flexible substrate including a bending area;
    an insulating layer formed on the flexible substrate and including at least one cutout at the bending area; and
    a plurality of wires configured following a surface shape of the insulating layer at the bending area,
    wherein the at least one cutout includes sloped sidewalls protruding away from the flexible substrate.

2. The flexible display apparatus according to claim 1, wherein:
    a tangent line passing through any point on a surface of a sloped sidewall divides a cross-sectional plane of the flexible display apparatus into two sides, wherein the cross-sectional plane of the flexible display apparatus includes the tangent line; and
    the sloped sidewall where a tangent point of the tangent line is located is disposed on a same side of the tangent line.

3. The flexible display apparatus according to claim 1, wherein:
    the sloped sidewalls include a first sidewall and a second sidewall separated from each other;
    a bottom surface of the at least one cutout is configured between the first sidewall and the second sidewall; and
    in a direction far away from the bottom surface, an angle formed between a tangent line passing through any point on the first sidewall and a plane where the flexible substrate is located decreases gradually, and an angle formed between a tangent line passing through any point on the second sidewall and the plane where the flexible substrate is located decreases gradually.

4. The flexible display apparatus according to claim 3, wherein:
    the first sidewall includes a first end approaching a starting end of the bending area, and the second sidewall includes a second end departing from the starting end of the bending area; and
    an angle formed between a tangent line passing through the first end and the plane where the flexible substrate is located is smaller than or equal to about 40°.

5. The flexible display apparatus according to claim 4, wherein:
    an angle formed between the tangent line passing through the first end and the plane where the flexible substrate is located is equal to about 0°.

6. The flexible display apparatus according to claim 3, wherein:
    an orthogonal projection of the sloped sidewall onto the plane where the flexible substrate is located has a length D;
    the insulating layer has a thickness V; and
    $D/V \geq 2$.

7. The flexible display apparatus according to claim 6, wherein:
    the thickness V of the insulating layer is approximately 0.02 μm~2 μm.

8. The flexible display apparatus according to claim 6, wherein:
    the length D is approximately 20 μm~300 μm.

9. The flexible display apparatus according to claim 1, further including:
    a plurality of cutouts distributed separately in a length direction of the plurality of wires.

10. The flexible display apparatus according to claim 1, wherein:
    a width W of the at least one cutout is $W \geq (n/180°)\pi R$, where $0° < n \leq 180°$, and R is a bending radius.

11. The flexible display apparatus according to claim 10, wherein:
    the width W of the at least one cutout is $W \geq \pi R$.

12. The flexible display apparatus according to claim 11, wherein:
    the sloped sidewalls include a first sidewall and a second sidewall;
    a bottom surface of the at least one cutout is configured between the first sidewall and the second sidewall; and
    the bottom surface has a width W2, wherein $W2 \geq \pi R$, where R is a bending radius.

13. The flexible display apparatus according to claim 1, wherein:
    the bending area is bent with respect to a bending axis; and
    a direction that the at least one cutout extends is parallel with the bending axis.

14. The flexible display apparatus according to claim 1, wherein:
    the flexible substrate includes a display area and a non-display area;
    the bending area is configured in the non-display area; and
    the flexible display apparatus further includes:
        a display unit formed in the display area of the flexible substrate, wherein the plurality of wires are electrically connected to a plurality of signal lines included in the display unit; and
        a driving integrated circuit and a plurality of pad electrodes formed in the non-display area, wherein the driving integrated circuit and the plurality of pad electrodes are electrically connected to the plurality of wires, and when the bending area is bent, the driving integrated circuit and the plurality of pad electrodes overlap with back of the display unit through the bending area.

15. The flexible display apparatus according to claim 1, wherein:
    the insulating layer includes at least one inorganic layer stacked on flexible substrate; and
    the at least one cutout is at least configured in an outermost film layer in the at least one inorganic layer.

16. The flexible display apparatus according to claim 15, wherein:
    the flexible substrate includes a display area and a non-display area;
    a display unit is configured in the display area of the flexible substrate;
    the display unit includes a gate insulating layer and an inter-layer insulating layer; and
    the at least one inorganic layer includes at least one of the gate insulating layer and the inter-layer insulating layer.

17. The flexible display apparatus according to claim 16, wherein:
   at least one of a buffer layer and a barrier layer is configured between the flexible substrate and the display unit; and
   the at least one inorganic layer includes at least one of the buffer layer, the barrier layer, the gate insulating layer, and the inter-layer insulating layer.

18. The flexible display apparatus according to claim 17, wherein:
   the insulating layer and the plurality of wires are covered by a passivation layer.

19. The flexible display apparatus according to claim 18, wherein:
   the passivation layer includes at least one organic layer.

20. The flexible display apparatus according to claim 1, wherein:
   a depth of the at least one cutout is equal to a thickness of the insulating layer;
   the plurality of sloped sidewalls include a first sidewall and a second sidewall separated from each other;
   a bottom surface of the at least one cutout is configured between the first sidewall and the second sidewall;
   the bottom surface of the at least one cutout is located in the bending area; and
   a distance between an edge of the insulating layer and a starting end of the bending area is greater than or equal to about 50 µm.

* * * * *